United States Patent [19]

Angelo et al.

[11] 4,376,057

[45] Mar. 8, 1983

[54] ETCHANT COMPOSITION AND USE THEREOF

[75] Inventors: Raymond W. Angelo, Endwell; Peter Bakos, Endicott, both of N.Y.

[73] Assignee: International Business Machines Corporation, Armonk, N.Y.

[21] Appl. No.: 211,000

[22] Filed: Nov. 26, 1980

[51] Int. Cl.³ .................... C09K 13/08; C09K 13/06
[52] U.S. Cl. .................... 252/79.4; 252/79.3; 252/79.2; 156/664; 430/318
[58] Field of Search .................. 252/79.2, 79.3, 79,4; 430/314, 318; 156/664, 659.1

[56] References Cited

U.S. PATENT DOCUMENTS

| | | | |
|---|---|---|---|
| 2,230,156 | 1/1940 | Lutman | 41/42 |
| 2,687,345 | 8/1959 | Murray | 41/42 |
| 3,108,931 | 10/1963 | Wendell | 156/659.1 |
| 3,389,065 | 6/1968 | Shibasaki | 252/79.4 |
| 3,389,066 | 6/1968 | Shibasaki | 252/79.4 |
| 3,709,824 | 1/1971 | Oda et al. | 252/142 |
| 3,767,491 | 10/1973 | Chough | 156/5 |
| 4,308,091 | 12/1981 | Schmitt et al. | 252/79.2 |

FOREIGN PATENT DOCUMENTS 571939 9/1977 U.S.S.R. ......................... 156/664

*Primary Examiner*—Edward C. Kimlin
*Assistant Examiner*—F. K. Wine
*Attorney, Agent, or Firm*—Pollock, Vande Sande & Priddy

[57] ABSTRACT

An aqueous acidic composition suitable for etching containing an acid and polyvinyl alcohol and use thereof.

11 Claims, No Drawings

ETCHANT COMPOSITION AND USE THEREOF

DESCRIPTION

1. Field of Invention

The present invention is concerned with compositions suitable for use as etchants and use thereof. The compositions are especially suitable for etching chrome. In particular, the present invention is concerned with improved acidic etching compositions. The compositions of the present invention are especially applicable in etching chrome circuitry lines for integrated circuit chips.

2. Background Art

The manufacture of integrated circuit electronic packages involves the interconnection between the integrated circuit carrier or substrate and the integrated semiconductor device or chip. Many commercial integrated circuit carriers are fabricated by applying to a ceramic substrate or carrier, a chrome layer, followed by a copper layer, followed by another chrome layer. Also, sometimes a cermet layer is placed between the ceramic substrate and bottom chrome layer. Next, a photoresist composition is applied so that selected areas of the chrome/copper/chrome/cermet layers can be removed to provide the desired electrical connections on the substrate. The top chrome layer is present so that subsequently applied solder will not adhere to the substrate in those areas where the chrome remains. The copper layer provides electrical conductivity. The bottom chrome layer is employed to insure adequate adhesion between the copper and the cermet. The cermet in conjunction with subsequently applied metal acts as a resistor in the final product. Presently, the etching of the chrome layers is carried out employing etchant compositions having high pH, such as aqueous compositions containing $KMnO_4$. The use of aqueous etchant compositions having high pH is not entirely satisfactory, since $KMnO_4$ tends to attack the cermet and copper layers to some extent as well as the chrome layers. Moreover, the use of aqueous etchants which are highly basic has resulted in the use of negative photoresists for defining the particular circuitry involved. Commercially available positive photoresist materials are not resistant to the highly basic etchant compositions employed to etch the chrome, and, accordingly, will not protect the areas which are not to be etched. The ability to employ a positive photoresist would be quite advantageous for a number of reasons. For instance, a positive photoresist is less sensitive to dirt or other contaminants than is a negative photoresist, since only the exposed areas of a positive photoresist are developed and are etched away. Accordingly, if dirt or some other contaminant is present, it will remain on the unexposed portion; thus, it will not play a significant part in regard to formation of defects. On the other hand, with a negative photoresist, the exposed areas are cured and the unexposed areas are etched away.

In addition, the ability to use a positive photoresist makes it possible to employ a single coating to prepare several different circuits by exposing, developing and etching the required surface and then repeating the steps as many times as needed. In addition, the light employed can be yellow light. Furthermore, positive resists provide sharper image resolution as compared to negative resists, since the desired image does not swell and, thereby, remains unchanged during the development with the particular solvent. In addition, the unexposed positive photoresist can be readily removed when desired, such as by simple chemical solvents including N-methyl-2-pyrrolidone for many commercially available positive resists and/or reexposed to suitable light and then removed with the same solution employed to develop the circuitry.

However, the various commercially available positive photoresists, such as the methacrylate polymers, necessitate an etchant for the underlying chrome which is on the acidic side. Although certain acidic etchants have been suggested for chrome, such are not entirely suitable for large scale production. For instance, the etching with various prior acidic etchants is very slow at start but then accelerates very rapidly forming or generating relatively large amounts of gas which are uncontrollable and cause the formation of bubbles. This is not suitable, especially for fine line circuitry. Moreover, sometimes the chrome surface is not even etched at all in such acidic etchants which may be possibly due to passivation of the chrome surface.

SUMMARY OF INVENTION

The present invention provides an etchant composition which is acidic and which is capable of etching chrome in a controllable and quick manner. In addition, the etchant compositions of the present invention make it possible to employ positive photoresists which are commercially available, since such are resistant to the etchant compositions of the present invention. The etchant compositions of the present invention provide for uniform etching. In addition, the preferred etchant compositions of the present invention can be employed at normal room temperatures. Moreover, the compositions of the present invention are pH stable during use and over long periods of time and can be stored without a detrimental effect to the composition for relatively long periods of time. With the etchant compositions of the present invention, bubble formation is substantially if not entirely eliminated. Also, excellent resolution is achieved with the etchant compositions of the present invention.

The etchant compositions of the present invention are acidic aqueous compositions which contain water, an inorganic acid, polyvinyl alcohol, and preferably transition metal ions. The polyvinyl alcohol is employed in an amount sufficient to improve the uniformity of the etching of the composition, and the transition metal ions when present in an amount which is sufficient to accelerate the etching.

In addition, the present invention is concerned with a method for etching chrome which includes contacting the chrome with an aqueous acidic composition which contains an inorganic acid and polyvinyl alcohol in an amount sufficient to improve the uniformity of the etching.

DESCRIPTION OF PREFERRED AND VARIOUS EMBODIMENTS

The acidic aqueous compositions of the present invention contain an inorganic acid. The acid employed must be capable of etching chrome, examples of which are hydrofluoric acid, sulfuric acid, and preferably hydrochloric acid. Mixtures of acids can be used if desired. Preferably, the compositions should be substantially if not entirely free from nitric acid, since such tends to attack copper. Copper is present beneath the top chrome layer in the preferred articles treated by the compositions of the present invention. The acid is present in the composition in amounts sufficient to etch the chrome. The amounts are usually about 2 to about 50% by weight of the aqueous solution. Preferred amounts of acid are usually about 2 to about 20% by weight of the composition. In addition, the amounts of acid present are such that the composition is acidic (i.e. pH≦5). The pH of the aqueous etchant is generally about 0.1 to about 5, and preferably about 0.1 to about 4.5.

In addition, the compositions of the present invention must include polyvinyl alcohol. Preferably, the polyvinyl alcohol employed has a molecular weight such that it is soluble in cold water. However, polyvinyl alcohol which can be dissolved in the compositions at elevated temperatures and then which remain soluble upon cooling down can be employed if desired. Generally, the polyvinyl alcohol employed has at least 92% of the acetate groups hydrolyzed, and, preferably, at least about 98% hydrolyzed. An example of a particular polyvinyl alcohol employed is Elvanol 72-51 from Du Pont which is about 99 to about 99.8% hydrolyzed. The presence of the polyvinyl alcohol stabilizes the compositions and provides for more uniform etching. Furthermore, the polyvinyl alcohol provides for increased viscosity which is beneficial in preventing gas formation. The viscosity of the compositions is generally about 5 to about 100 centistokes measured at 25° C. The amount of polyvinyl alcohol employed is usually about 1 to about 25% by weight.

Although, the composition which contains the polyvinyl alcohol can be employed to etch chrome, the etching is somewhat slow and requires elevated temperatures. Accordingly, preferred compositions according to the present invention also include water soluble compounds of a transition metal, such as inorganic and organic salts of transition metals. Suitable transition metals include chromium, manganese, iron, cobalt, nickel, copper, molybdenum, palladium, and platinum. The preferred transition metals are nickel and cobalt. The anionic portion of the metallic compounds employed can be organic or inorganic, since the anionic portion is not crucial to the function of the transition metal ions in the composition provided the compounds are soluble in the aqueous acid compositions. Examples of suitable anionic portions include sulfate, chloride, fluoride, and phosphate groups, as well as moieties from organic carboxylic acids. The organic carboxylic acids can be monocarboxylic or polycarboxylic, and preferably are saturated or ethylenically unsaturated aliphatic carboxylic acids containing 2 to about 10 carbon atoms and up to 3 carboxyl groups. Groups from the organic acids usually contain only carbon, hydrogen and oxygen and can include hydroxyl radicals. Examples of some monocarboxylic acids from which the anionic moiety is obtained include acetic acid, lactic acid, and glutonic acid. Examples of some polycarboxylic acids from which the anionic portion of the compounds can be derived include maleic acid, fumaric acid, tartaric acid, succinic acid, and citric acid. The preferred anionic groups include chloride and sulfate groups.

The preferred transition metal compounds employed according to the present invention are nickel chloride and cobalt chloride. Mixtures of metal compounds can be employed if desired.

The transition metal compounds act as accelerators and also make it possible to carry out the etching in relatively short periods of time at relatively low temperatures, for example normal room temperatures. The amount of transition metal ions present in the composition when employed is about 0.01 to about 8% by weight. Since it is the metal ion portion of the compounds which is important, the amount employed is based upon the metal ion portion rather than the entire compound.

The compositions of the present invention are especially suitable for etching chrome and for selectively etching chrome layers without affecting underlying copper, if present, and without affecting positive photoresist materials. In addition, most of the negative photoresist materials are also resistant to the compositions of the present invention. The etching can be achieved by immersing the particular article to be etched in a bath of the composition and maintaining the material to be etched in contact with the composition for about 10 seconds to about 10 minutes, and preferably for about 15 seconds to about 60 seconds. The composition can be employed at room temperature or at temperatures up to about the boiling point of the compositions, and preferably no higher than about 90° C. The time and temperature of the etching are inversely related. That is, at the lower temperatures the longer immersion times of up to about 10 minutes are employed for etching away about 800 Å of chromium. Also, the time is somewhat related to the amount or thickness of material to be etched away.

A particular type of article treated according to the present invention includes a ceramic on top of which is a cermet, on top of which is a first layer of about 800 Å chromium, followed by a layer of about 800 Å of copper, followed by another 800 Å of chromium.

Examples of ceramic substrates include aluminum oxides, silicon oxides and aluminum silicate. An example of a suitable cermet is obtained from firing a composition containing chrome, silicon dioxide and aluminum dioxide.

The following nonlimiting examples are presented to further illustrate the present invention.

EXAMPLE 1

An etch solution containing about 74.7 parts by weight of water, about 20 parts by weight of a 37% hydrochloric acid aqueous solution, about 5 parts by weight of polyvinyl alcohol (Elvanol 72-51 from Du Pont), and about 0.3 parts by weight of nickel chloride is prepared.

PART A

An aluminum dioxide ceramic substrate having an 800 Å layer of chrome, on top of which is an 800 Å layer of copper, on top of which is another 800 Å layer of chrome is immersed in the above etch solution. The solution is at a temperature of about 30° C. The top chrome layer is removed in about 6 minutes. Only very slight gas formation or bubbles from the etching is observed.

PART B

Part A is repeated, except that the temperature of the etchant is about 65° C. The results obtained are similar to those of Part A of this example, except that the top chrome layer is removed in about 30 seconds.

EXAMPLE 2

Parts A and B of Example 1 are repeated, except that the etch solution employed contains about 64.7 parts by weight of water, about 30 parts by weight of a 37% hydrochloric acid aqueous solution, about 5 parts by weight of the polyvinyl alcohol, and about 0.3 parts by weight of nickel chloride. The results obtained are similar to those of Example 1, except that the etch time needed at 30° C. is somewhat lower as compared to that needed in Part A of Example 1.

EXAMPLE 3

Example 1 is repeated, except that the etch solution contains about 73.7 parts by weight of water, about 20 parts by weight of a 37% hydrochloric acid aqueous solution, about 5 parts by weight of the polyvinyl alcohol, and about 1.3 parts by weight of nickel chloride. The results obtained are similar to those of Example 1. The higher amount of nickel chloride employed in this example as compared to Example 1 does not change the etchability of the composition.

EXAMPLE 4

Example 1 is repeated, except that the etch solution employed employed contains about 64.7 parts by weight of water, about 20 parts by weight of a 37% hydrochloric acid aqueous solution, about 15 parts by weight of the polyvinyl alcohol, and about 0.3 parts by weight of nickel chloride. The results obtained are similar to those of Example 1, except that gas generation is completely eliminated. However, the time needed to rinse and remove the etchant from the article treated is somewhat longer as compared to Example 1. In addition, it is observed that the etchability of the composition does not improve with amounts of the polyvinyl alcohol above about 2.5% by weight of the composition.

EXAMPLE 5

Example 1 is repeated, except that the etch solution employed contains about 0.3 parts by weight of cobalt chloride in place of the nickel chloride. The results obtained are similar to those of Example 1, except that the cobalt chloride is not as effective in the composition when such is employed at the lower temperature of about 25° to about 35° C.

EXAMPLE 6

Example 1 is repeated, except that the etch solution employed contains about 76 parts by weight of water, about 20 parts by weight of a 37% hydrochloric acid aqueous solution, about 3.5 parts by weight of polyvinyl alcohol, and about 0.5 parts by weight of nickel chloride. In addition, the etching is tested at temperatures of the etch solution up to about 80° C. It is determined that the optimum temperature of operation for this etching composition is about 55°±2° C. The chrome layer is etched in about 55 seconds at this temperature.

EXAMPLE 7

Example 1 is repeated, except that the composition contains about 74.3 parts by weight of water, about 22 parts by weight of a 37% aqueous hydrochloric acid solution, about 3.5 parts by weight of the polyvinyl alcohol, and about 0.2 parts by weight of nickel chloride. The results obtained are similar to those of Example 1. It is observed that this composition is exceptionally stable. This composition is considered to be the preferred of the compositions tested. In particular, the composition is stable for about 3 months in an open cup, and it is projected that such can be stored for years under a sealed condition. In addition, such is quite suitable for etching at temperatures of about 30° C. with very little gas generation. The composition is the least sensitive to small changes in temperature. The etching achieved is quite uniform.

EXAMPLE 8

Example 1 is repeated, except that the composition contains about 74 parts by weight of water, about 20 parts by weight of a 37% aqueous hydrochloric acid solution, about 5 parts by weight of polyvinyl alcohol, about 0.5 parts by weight of nickel chloride, and about 0.5 parts by weight of cobalt chloride. The results obtained are similar to those of Example 1.

EXAMPLE 9

Example 1 is repeated, except that the etchant solution employed contains about 76 parts by weight of water, about 20 parts by weight of a 37% hydrochloric acid solution, about 3.5 parts by weight of polyvinyl alcohol, about 0.2 parts by weight of nickel chloride, and about 0.25 parts by weight of cobalt chloride. The results obtained are similar to those of Example 1.

EXAMPLE 10

Example 1 is repeated, except that the etchant solution employed contains about 76 parts by weight of water, about 20 parts by weight of a 37% hydrochloric acid solution, about 3.5 parts by weight of polyvinyl alcohol, and about 0.5 parts by weight of cobalt chloride. The results obtained are similar to those of Example 1.

COMPARISON EXAMPLE 11

Example 1 is repeated, except that the etchant solution employed contains about 70 parts by weight of water, about 0.5 parts by weight of nickel chloride, about 20 parts by weight of a 37% aqueous hydrochloric acid solution, and about 9.5 parts by weight of polyvinyl pyrrolidone. The etch solution is operated at temperatures of about 40° to about 60° C.

The solution is capable of etching chrome, except that the amount of gas generated is very significant. On the other hand as noted from above, no or only very little gas generation occurs when polyvinyl alcohol is employed. Moreover, it is noted that the solution with polyvinyl pyrrolidone is not as stable, both as to pH change and as to shelf life deterioration, as compared to the compositions of the present invention with polyvinyl alcohol.

Furthermore, compositions are tested wherein the amount of polyvinyl pyrrolidone employed is 5%, 10%, and 20% by weight. These compositions also did not prevent the generation of significant amounts of gas during the etching.

What is claimed is:

1. An acidic aqueous etchant composition having a pH of about 5 or less suitable for etching chrome containing water, about 2 to 50% by weight of hydrochloric acid, polyvinyl alcohol in an amount of about 1 to about 25% by weight and being sufficient to improve the uniformity of the etching, and transition metal ions in an amount of about 0.1 to about 8% by weight and being sufficient to accelerate the etching, wherein said transition metal ions are selected from the group of nickel, cobalt, and mixtures thereof.

2. The composition of claim 1 wherein the acid is present in an amount of about 2 to about 20% by weight.

3. The composition of claim 1 wherein the pH is about 0.1 to about 5.

4. The composition of claim 1 wherein the pH is about 0.1 to about 4.5.

5. The composition of claim 1 wherein said polyvinyl alcohol is cold water soluble.

6. The composition of claim 1 wherein said transition metal ions are from compounds from the group of nickel chloride, cobalt chloride or mixtures thereof.

7. The composition of claim 1 wherein the viscosity is about 5 to about 100 centistokes measured at 25° C.

8. The composition of claim 1 wherein said polyvinyl alcohol is cold water soluble and has at least 92% of the acetate groups hydrolyzed, and the viscosity is about 5 to about 100 centistokes measured at 25° C.

9. The composition of claim 1 wherein said acid is present in an amount of about 2 to about 20% by weight and wherein the pH is about 0.1 to about 4.5.

10. The composition of claim 5 or 1 wherein said polyvinyl alcohol has at least 92% of the acetate groups hydrolyzed.

11. The composition of claims 5 or 1 wherein said polyvinyl alcohol has at least about 98% of the acetate groups hydrolyzed.

* * * * *